(12) United States Patent
Ammon et al.

(10) Patent No.: US 6,518,769 B1
(45) Date of Patent: Feb. 11, 2003

(54) METHOD AND DEVICE FOR THE ELECTRICAL MONITORING OF AN ELECTRODE LEAD OF A BIPOLAR HIGH-VOLTAGE D.C. TRANSMISSION SYSTEM

(75) Inventors: Jörg Ammon, Erlangen (DE); Gerhard Plewka, Baiersdorf (DE); Gerhard Schaller, Hemhofen (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 09/674,336
(22) PCT Filed: Apr. 16, 1999
(86) PCT No.: PCT/DE99/01144
§ 371 (c)(1), (2), (4) Date: Feb. 9, 2001
(87) PCT Pub. No.: WO99/56140
PCT Pub. Date: Nov. 4, 1999

(30) Foreign Application Priority Data

Apr. 29, 1998 (DE) .......................... 198 19 219

(51) Int. Cl.⁷ .............................................. G01R 31/11
(52) U.S. Cl. ...................................... 324/534; 324/524
(58) Field of Search ................................ 324/527, 534, 324/541, 688

(56) References Cited

U.S. PATENT DOCUMENTS

| | | | | |
|---|---|---|---|---|
| 4,837,671 A | * | 6/1989 | Wild et al. ................. | 363/35 |
| 5,083,086 A | * | 1/1992 | Steiner ....................... | 324/533 |
| 5,481,195 A | * | 1/1996 | Meyer ........................ | 324/534 |
| 5,600,248 A | * | 2/1997 | Westrom et al. ........... | 324/522 |
| 5,608,328 A | * | 3/1997 | Sanderson .................. | 324/529 |
| 6,313,640 B1 | * | 11/2001 | Nasrallah et al. .......... | 324/536 |

FOREIGN PATENT DOCUMENTS

| | | |
|---|---|---|
| DE | 39 26 414 | 2/1990 |
| DE | 44 25 551 | 2/1996 |
| DE | 691 17 712 | 10/1996 |
| DE | 196 50 974 | 6/1998 |
| EP | 0 360 109 | 3/1990 |
| EP | 0 391 143 | 10/1990 |

\* cited by examiner

*Primary Examiner*—Christine Oda
*Assistant Examiner*—Walter Benson
(74) *Attorney, Agent, or Firm*—Kenyon & Kenyon

(57) ABSTRACT

To monitor an electrode lead composed of two lines in a bipolar HVDCT system, a balanced-to-ground pulse formed from an unbalanced-to-ground pulse in push/pull mode is fed into the lines and an actual echo curve is recorded from the echo signals and compared to a dynamic target echo curve, a fault signal being generated when a tolerance band placed around the echo difference curve is exceeded. In this way, a monitoring method is achieved which is nearly independent of the sharply fluctuating ground conductance, which has a higher range with simultaneously lower dispersion of the echo, which radiates less electromagnetic energy and which requires no additional decoupling elements.

24 Claims, 6 Drawing Sheets

METHOD AND DEVICE FOR THE ELECTRICAL MONITORING OF AN ELECTRODE LEAD OF A BIPOLAR HIGH-VOLTAGE D.C. TRANSMISSION SYSTEM

FIELD OF THE INVENTION

The present invention relates to a method and a device for the electrical monitoring of an electrode lead of a bipolar high-voltage d.c. transmission system in which the electrode lead is divided into two lines at a branch point.

BACKGROUND INFORMATION

Systems for transmitting power by means of a high-voltage d.c. current contain two static converter stations that are connected to each other by a d.c. line. In the case of a single-pole d.c. transmission system, both stations are connected to each other by a single d.c. line, the return current being routed through ground. A d.c. pole in each station is then grounded by a good ground connection. Normally, this ground connection is located at a certain distance from the static converter station and connected to the station by an electrical line that is called an electrode lead. It can often be desirable or necessary to locate the ground connection at a great distance of up to one hundred kilometers from the station.

In the case of a double-pole d.c. transmission system, the stations are connected to each other by two d.c. current lines so that in normal operation the direct current does not need to return through the ground. For various reasons, i.e., to enable single-pole operation of the system in the event of a static converter failure, static converter stations in double-pole d.c. transmissions are provided with a ground connection that is connected to the station by an electrode lead.

An electrode lead is insulated from ground and normally is made of a multiple-wire, twisted conductor that is suspended on insulators. Although the voltage between the electrode lead and ground is normally small compared to other voltages in the system, a ground fault on the electrode lead constitutes the danger of personal injuries or damage to other system components, e.g., corrosion. It is therefore necessary to be able to discover ground faults quickly and reliably, including high-impedance ground faults and open circuits.

To locate ground faults on an electrode lead, a differential protective arrangement has conventionally been used. In a protective arrangement of this type, the current is measured at both ends of the electrode lead and a difference between the two measured currents means that a ground fault is present. However, a protective arrangement of this type has various disadvantages. It requires a communication link between the two ends of the electrode lead and therefore is expensive, especially in connection with long electrode leads. A protective arrangement of this type also does not react to a ground fault that occurs in those cases in which the electrode lead is not conducting any current, which is normally the case during operation of a double-pole transmission system without faults. Even in this case, i.e., if no direct current is flowing through the electrode lead, asymmetric currents can lead to the creation of dangerous voltages on the lead.

Ground faults on an electrode lead have also been located by injecting an alternating current signal or alternating voltage signal at a specific frequency into the lead at the static converter station. In this case suppression filters are used at both ends of the line, these filters being tuned to the frequency of the injected signal. An impedance measurement element is used to measure the impedance of the electrode lead opposite ground at the feed point at the injected frequency. A change of the impedance measured in this way is an indication of a ground fault. This method works well in cases of short electrode leads. To detect a line fault, the measurement frequency must be selected so that the length of the line is less than one quarter of the wavelength. For this reason, in the case of long electrode leads, a frequency must be selected that is so low that there is a danger of the measurement being disturbed by the mains frequency or by the lowest harmonics of the mains frequency. Furthermore, at these low frequencies, the suppression filters placed at both ends of the electrode lead—which must be rated for the maximum current on the electrode lead—become very large and expensive.

European Patent No. 0 360 109 describes a protective device for an electrode lead in which a high measurement frequency can also be used in the case of long electrode leads, thereby substantially reducing the dimensions and costs of the suppression filters as well as the danger of interference by the mains frequency or its harmonics. To prevent standing waves on the electrode lead, the suppression filter on the end of the electrode lead farthest from the feed point is provided with resistive elements that have a resistance such that the filter is matched to the characteristic impedance of the electrode lead. This prevents the measurement signal from being reflected at the far end of the electrode lead.

A method for the location of a point of fault in a cable is described in U.S. Pat. No. 5,083,086. According to this method for determining location, a repair technician executes this procedure, according to which the faulty cable is first disconnected, i.e., the cable is not in service. Next, a device used to execute the method for fault location is connected to the end of the disconnected cable. This device feeds a first electrical pulse into the cable and records the received reflections. After that, a voltage applied to the disconnected cable is increased, a second pulse is fed into the cable and the received reflections are recorded. By increasing the feed voltage, the impedance at the fault location in the cable changes so that a reflection that uniquely reproduces the fault location can be received. The recorded echo signals are compared to each other. Using this differential signal and a measured propagation time, the fault location in the cable can then be calculated.

To detect the state of an electrode lead of a bipolar high-voltage d.c. transmission system (HVDCT system), a method is described in German Patent Application No. 196 50 974.2 in which a first electrical pulse is fed to a first end of the electrode lead and an echo signal of this lead is detected. Next, a second pulse is fed into the line on the first end and its echo signal is detected. These two echo signals are then compared to each other. When there is a deviation and/or an agreement between the two echo signals, a corresponding indicator signal is generated. These process steps are continuously repeated until an error signal is generated. This indicator signal is used to stop the state measurement process. The fault location can be determined using recorded echo signals. A comparison of the faulty echo signal with stored echo signals for different operating conditions enables a more rapid determination of the error (ground fault, open circuit. . . ).

A device for performing this method has a pulse generator, an evaluation device and a coupling element. Through this coupling element, the pulse of the pulse generator is fed into the electrode lead and its echo signal is forwarded to the evaluation unit. The device is connected to one end of the electrode lead. The other end of the electrode lead is connected to ground. In order for the electrical pulse not to enter the HVDCT system, but rather only the section of the electrode lead to be monitored, the electrode lead is provided at its ends with attenuators. The evaluation device includes a comparator, a memory and a trigger device. The pulse generator-synchronized to a timer-generates rectangular, pulses with a d.c. offset. These pulses are continuously fed into the electrode lead until there is an error signal.

This method permits simple error detection in the operation of the HVDCT system without the need to use existing measurement signals. The method thus operates self-sufficiently. Since, in the fault-free case, the ground plays a part in conducting the pulse, fluctuating ground conductance affects the echo signals and thus a reliable detection of errors. Moreover, the radiation of electromagnetic energy, which is caused by the pulse in common mode, is rather high. An additional disadvantage lies in that, on both ends of the electrode lead, attenuators must be connected in series in this electrode lead. As a result, the expense for a retrofit installation in an existing HVDCT system is becoming rather high.

SUMMARY

An object of the present invention is to provide a method for monitoring an electrode lead of a bipolar HVDCT system that no longer has the previously mentioned disadvantages and to specify an appropriate device to utilize the method.

By generating, according to the method of the present invention, a symmetric pulse signal in push-pull mode from an asymmetric pulse signal and injecting it into the two lines of the electrode lead, the ground hardly plays any further part in the transmission of these pulses, so that the method according to the present invention is nearly independent compared to a sharply fluctuating ground conductance. An additional advantage lies in that the radiation in the form of electromagnetic energy is substantially reduced compared to a common mode signal. Moreover, the push/pull mode creates a slight line attenuation so that a greater transmission range of the system accompanied by simultaneously smaller dispersion of the echo signal is allowed.

An advantage of the push/pull mode is its complete decoupling from the common mode. Interfering signals that come from the HVDCT system can propagate only in common mode since on this side of the branch point the electrode lead is combined into a single conductor and thus an electromagnetic field can exist only between this conductor and ground. Interfering signals coming from the HVDCT system propagate to the electrode lead nearly at the speed of light, are divided at the branch point with nearly identical amplitude and phase and then travel on the two waveguides, namely conductor-ground and conductor-ground, to the end of the electrode lead most distant from the system. However, between the feed connections mounted at equal distances from the branch point, these interfering signals cannot generate any voltage, leading to an ideal, frequency-independent decoupling of the method for monitoring the electrode lead from the HVDCT system. On the other hand, because of the reciprocity of the electrode lead, no signals that are fed to the feed connections in push/pull mode reach the HVDCT system, resulting in the method being independent of whatever circuit states may exist in the HVDCT system. In order to be able to inject a signal in push/pull mode into the electrode lead composed of two lines, the short circuit for this mode is made inactive in the branch point. This could, for example, be brought about by connecting a high-inductance coil in series in the electrode lead between each of the feed connections and the branch point. Since, in single-pole mode, currents in the kA order of magnitude flow through the electrode lead, the two coils needed for this would also be designed for these currents.

An example embodiment of the method according to the present invention provides for implementing the injection of pulse signals in push/pull mode without such components as the coils mentioned. This is possible if the feed points are located at a predetermined distance from the branch point, this distance being sized so that it corresponds to approximately one quarter of the conduction wavelength at the center frequency of the generated unbalanced-to-ground pulse. At this frequency, the short circuit is transformed in the branch point into an open circuit at the feed connections, and at adjacent frequencies this short circuit is transformed into a high-impedance reactance, which, at the feed connections is to be considered as connected in parallel to the characteristic impedance of the line.

Another advantage of the method according to the present invention lies in that this monitoring procedure can independently adapt to different operating conditions. This is achieved by generating an echo difference curve as a function of a recorded actual echo curve and a stored, constructed dynamic target echo curve. By using a dynamic target echo curve that can vary over time, influences of the seasons on the electrode leads are taken into consideration so that an error case can be uniquely determined for each.

If an error signal is generated, then the monitoring process can be switched off. To do this the generation of pulses is interrupted or switched off.

In an advantageous embodiment of the method according to the present invention, a given static target echo curve is also generated and flanked by a tolerance band, which is determined by a limit curve running above and below this static target echo curve. A constructed dynamic target echo curve is then checked in relation to this static target echo curve as to whether at least one amplitude of this dynamic target echo curve is outside of the tolerance band of the static target echo curve. If this is the case at least once within a given time frame, an error signal is generated and the monitoring process is turned off. By using a given static target curve, defects can be detected in the device for monitoring the electrode lead that, if they occur gradually, would otherwise fall under an operating state that changes over time.

An additional advantageous embodiment of the method according to the present invention provides for the construction of the dynamic target echo curve from a mean value of at least two consecutive actual echo curves. In other words, a mean value is continually formed from a given number of consecutive actual echo curves and is stored as a dynamic target echo curve. As a result, with each new actual echo curve, a new mean value is stored as a dynamic target echo curve. However, this only happens if no indicator signal was generated during the evaluation of an echo difference curve.

A symmetric pulse signal in push/pull mode is generated from an asymmetric pulse signal that is generated by the pulse generator due to the availability of a feed device that is linked on the output side with each feed connection of the two lines of the electrode lead in the device provided for the utilization of the new monitoring method along with a pulse-echo monitoring device that has a pulse generator and a receiving unit. The pulse-echo monitoring device is linked to the inputs of the feed circuit. This feed circuit has on its input side a device for pulse conversion and on its output side two coupling capacitors that connect each of the outputs of the device for pulse conversion to a feed connection.

Due to the configuration of the feed device, first, a symmetric pulse signal in push/pull mode is generated from an unbalanced-to-ground pulse signal of the pulse generator, thereby introducing the previously mentioned advantages of push/pull mode over common mode and, secondly, interference that comes from the HVDCT system is transmitted only in a very sharply attenuated state to the receiving unit.

In an advantageous embodiment of the feed circuit, an isolation transformer with low-voltage and high-voltage windings, two coils and two diverters are provided as equipment for pulse conversion, one coil and one diverter being connected in parallel with each high-voltage winding. The connection point of the two high-voltage windings is connected to ground potential. The two coupling capacitors in conjunction with the two coils form two high-pass filters, which are each tuned to the center frequency of the generated pulse. The diverters protect the isolation transformer against excess voltages in the event of transient interference (lightning strike, switching surge).

According to another advantageous embodiment of the device according to the present invention, the pulse generator has two voltage sources, two capacitors, two switches, two resistors and one actuating device for the switches, each capacitor being electrically connected to a voltage source via a resistor so as to conduct. One connection point of these two capacitors and one connection point of the two voltage sources are each connected to ground potential. The capacitors can each be linked through a switch to the output of the pulse generator, the actuation device being connected to a control output of the pulse generator. Using a pulse generator of this type, a narrow-band, rectangular pulse with no d.c. offset and having a high spectral component at its center frequency is produced.

In principle, still other pulse shapes having the spectral characteristics already mentioned can be used for the new monitoring method. For example, a saw-tooth pulse running symmetrically with respect to the time axis can also be used. However, the generation of a pulse of this type is more complicated.

According to an additional beneficial embodiment of the new device, the receiving unit has a device for the real-time recording of echo signals, a processing unit, a main memory and an input and output interface, the control input of this feed unit being connected to the control input of the device for real-time recording of echo signals. The processing unit is connected to the main memory, the device for real-time recording and the interfaces. One signal input of the device for real-time recording is connected to the input of the receiving unit, the input and output side of a master system controller being connected to the output and input interfaces.

By connecting the control output of the pulse generator to the control input of the device for real-time recording, this device is triggered by the output of pulses by the pulse generator. In this way, the echo signals can be recorded for a given time, i.e., this part of the receiving unit is operated online. Further processing of these recorded echo signals occurs offline, this additional processing being handled centrally in the processing unit.

In the new device, the feed connections of the lines of the electrode lead are each located by design at a distance from a branch point of the electrode lead, this distance being in particular equal to one quarter of the free-space wavelength of the center frequency of the pulse. Through the selection of the distance of these feed connections from the branch point, circuit elements must not be connected in series in the electrode lead.

For the center frequency of the feed pulse, the short circuit in the branch point of the electrode lead is transformed over the ẽ/4 line into an open circuit at the feed location. The ẽ/4 length line together with the entire HVDCT system is thus electrically not present at this frequency. The supplied pulse at this frequency sees only the characteristic impedance of the two lines of the electrode lead that run to the ground electrode and to the branch point. At other frequencies, the short circuit in the branch point is transformed by way of the line, which is then no longer λ/4 long, into a reactance that can be considered connected in parallel to the characteristic impedance of the line at the feed location.

By utilizing system-side factors and by activating push/pull mode, no additional circuitry measures are needed to decouple the measurement arrangement from the station. In this way, expensive attenuation elements are unnecessary.

Additional beneficial embodiments of the device for monitoring an electrode lead of a bipolar HVDCT system can be seen in dependent claims 13 through 19.

DETAILED DESCRIPTION

Figure 1:
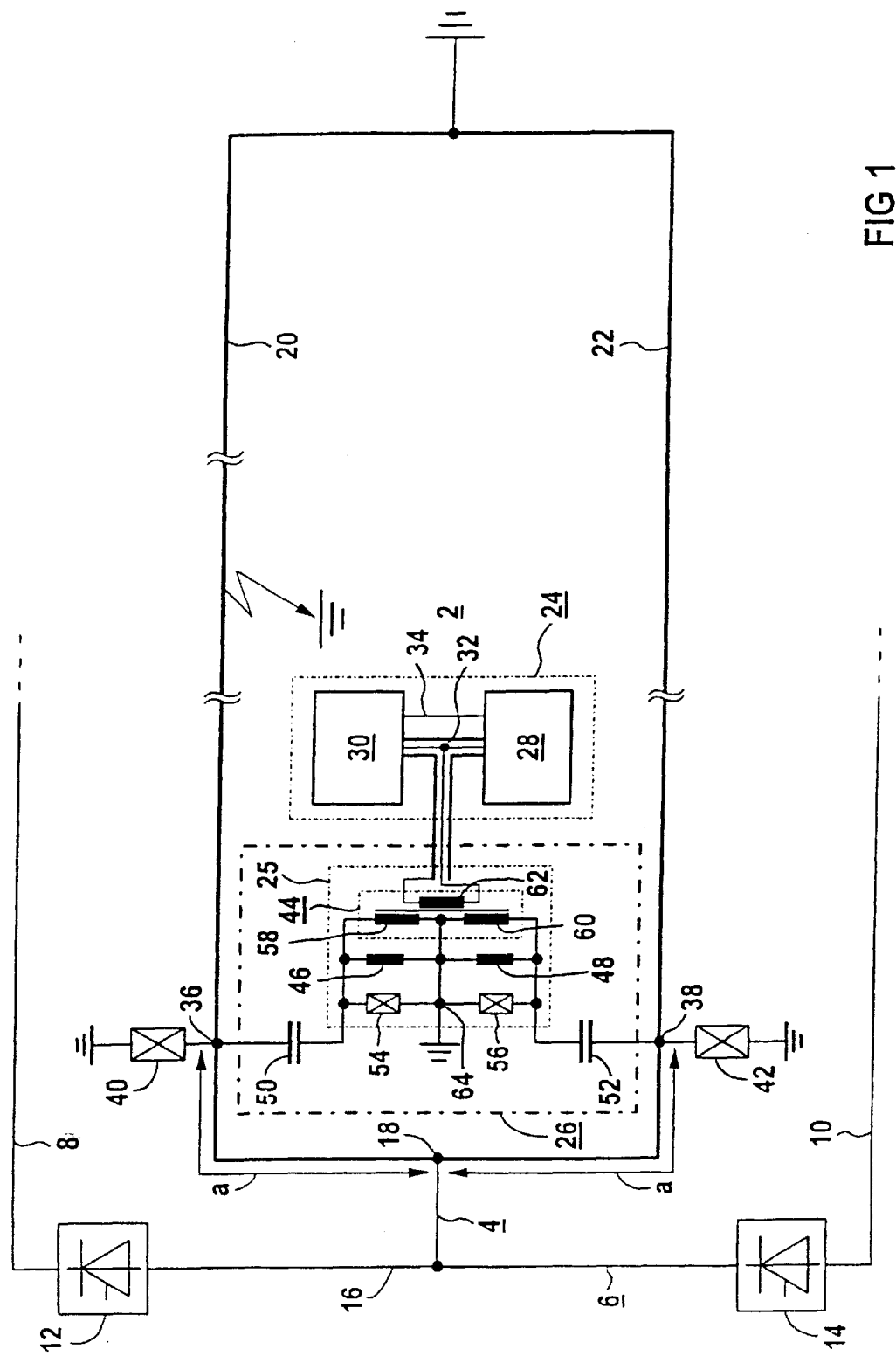
FIG. 1 shows a device according to an example embodiment of the present invention having one electrode lead of a bipolar HVDCT system.

FIG. 1 shows a device 2 according to an example embodiment of the present invention for monitoring an electrode lead 4 of a bipolar high-voltage d.c. transmission system, of which, for the purpose of giving an overview, only one static converter station 6 is depicted. In a bipolar HVDCT system, which is also called a double-pole d.c. transmission system, the two static converter stations are connected by two d.c. lines 8 and 10 and each station has two static converters 12 and 14 that are wired in series via a bus 16. In normal operation of this bipolar HVDCT system, the d.c. current is not returned via the ground. For various reasons, i.e., to enable single-pole operation of the system in the event of a static converter failure, the static converter stations in double-pole operation are also provided with a ground connection, which is connected via electrode lead 4 to station 6 using bus 16. This electrode lead 4 is insulated from ground and normally made of a line that is suspended on insulators. Electrode lead 4 depicted here is split by the branch point 18, the so-called splitting point, into two lines 20 and 22, the ends of which are linked to ground potential. These lines 20 and 22 of electrode lead 4 can be up to 100 km long, if necessary. The second static converter station (not shown here) of the bipolar HVDCT system is also equipped with an electrode lead, i.e., the HVDCT system is constructed with mirror symmetry.

During operation without faults—thus during symmetric operation—almost no current flows in electrode lead 4. Although the voltage between electrode lead 4 and ground is normally small compared to other voltages in the system, a ground fault on electrode lead 4 constitutes the danger of personal injury or damage to other system components. For this reason it is necessary to be able to detect ground faults, including high-impedance ground faults, quickly and reliably. Moreover, it is also important for safe operation of this bipolar HVDCT system to know the state of this electrode lead 4. In the event of an open circuit and a faulty operation of the HVDCT system, asymmetric operation of this double-pole HVDCT would then no longer be possible.

Figure 2:
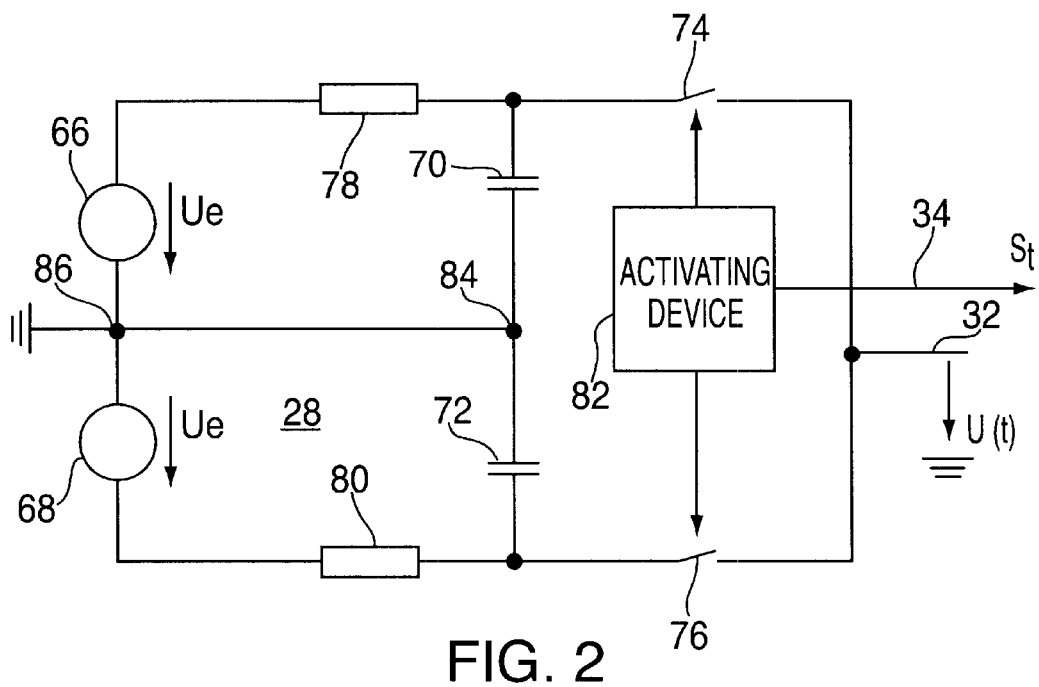
FIG. 2 shows a basic circuit diagram of the pulse generator the device according to FIG. 1.

To monitor electrode lead 4, composed of two lines 20 and 22, device 2 is provided according to the example embodiment of the present invention. This device 2 has a pulse echo monitoring device 24 and a feed device 26. This pulse echo monitoring device 24 composed of a pulse generator 28 and a receiving unit 30. Pulse generator 28, an example embodiment of which is depicted in greater detail in FIG. 2, is linked via a coaxial cable 32 to input connections of feed device 26. These connections of feed device 26 are, moreover, connected to input connections of receiving unit 30. In order to ensure as noise-free a signal as possible, this coaxial cable 32 may be double shielded. In addition, a control output of pulse generator 28 is linked to a control input of receiving unit 30 via a control line 34. Feed device 26 is connected on the output side to each feed connection 36 and 38 of lines 20 and 22 of electrode lead 4. These feed connections 36 and 38 are located at a distance from branch point 18, this distance a corresponding to approximately $\ddot{e}/4$, with $\ddot{e}/4$ representing the free-space wavelength of the center frequency of a generated pulse u(t) of pulse generator 28. Moreover, these feed connections 36 and 38 are each connected via a diverter 40 and 42 to ground potential. These two diverters 40 and 42 protect input device 26 on the high-voltage side from transient interference (lightening strike).

Feed device 26 has a device 25 for pulse conversion on the input side and has two coupling capacitors 50 and 52 on the output side. Device 25 for pulse conversion has an isolation transformer 44, two coils 46 and 48 and two diverters 54 and 56. This isolation transformer 44 composed of two high-voltage windings 58 and 60 and a low-voltage winding 62. Connection point 64 of the two high-voltage windings 58 and 60 is connected to ground potential. The two connections of the low-voltage winding 62 form the connections of feed device 26, to which coaxial cable 32 is connected. Coils 46 and 48 are wired electrically in parallel to high-voltage windings 58 and 60, respectively. In addition, diverters 54 and 56 are wired electrically in parallel to high-voltage windings 58 and 60, respectively, of isolation transformer 44. Coupling capacitors 50 and 52 connect feed points 36 and 38 to one connection of high-voltage windings 58 and 60, respectively. These two coupling capacitors 50 and 52 couple the feed device 26 to the high-voltage potential of electrode lead 4. Therefore, these coupling capacitors 50 and 52 must be designed for the corresponding high-voltage level of electrode lead 4. The two coils 46 and 48 arranged symmetrically with respect to ground potential, together with the two coupling capacitors 50 and 52, each form a high-pass filter. These high-pass filters block the low-frequency interference-characteristic current harmonics that are generated by the system and also flow through electrode lead 4 during asymmetric operation of the HVDCT system-coming from electrode lead 4. Diverters 54 and 56 protect high-voltage windings 58 and 60 of isolation transformer 44 from excess voltages in the event of transient interference (lightning strike, switching surge). These diverters 54 and 56 are sized for a much lower voltage than diverters 40 and 42. Isolation transformer 44 matches the characteristic impedance of coaxial cable 32 to the characteristic impedance of line 20 and 22 of electrode lead 4. Moreover, this isolation transformer 44 represents a symmetric transformer that produces a symmetric pulse signal in push/pull mode from the asymmetric pulse signal generated by a pulse generator.

Figure 3:
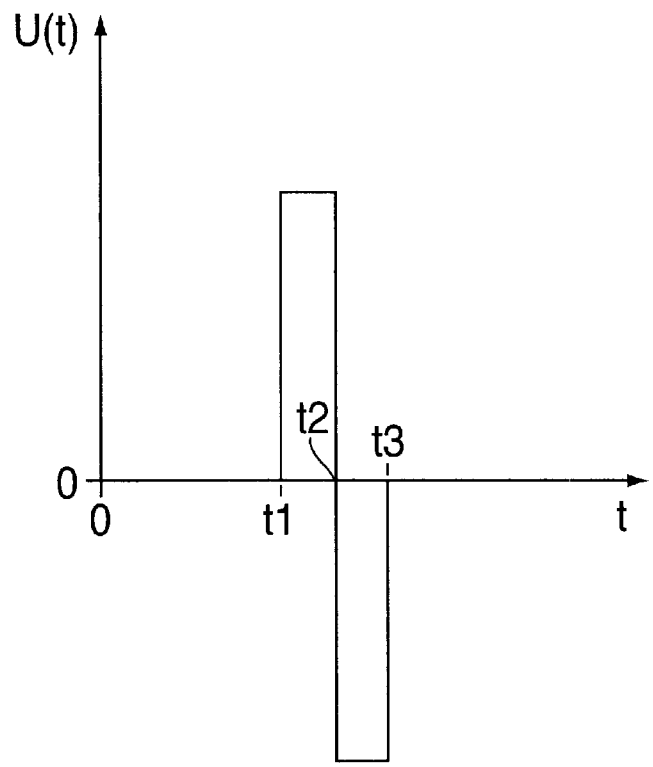
FIG. 3 a generated pulse is represented in a diagram as a function of time t.

FIG. 2 shows a basic circuit diagram of pulse generator 28 of pulse echo monitoring device 24 shown in FIG. 1. This pulse generator 28 has two voltage sources 66 and 68, two capacitors 70 and 72, two switches 74 and 76, two resistors 78 and 80 and an actuating device 82 for switches 74 and 76. Capacitors 70 and 72 are electrically connected via resistors 78 and 80, respectively, to voltage sources 66 and 68, respectively, so as to conduct. Connection point 84 of the two capacitors 70 and 72 is connected to connection point 86 of the two voltage sources 66 and 68, which, in turn, is connected to ground potential. The charging current of capacitors 70 and 72 is set using resistors 78 and 80. These capacitors 70 and 72 can each be connected via switches 74 and 76 to the output of pulse generator 28, to which coaxial cable 32 is connected. Electronic switches, for example transistors, are provided as switches 74 and 76. The configuration of actuating device 82 depends on the selection of the electronic switches. In addition, the operating frequency of switches 74 and 76 and the charging cycles are dependent upon each other. If capacitors 70 and 72 are charged, switch 74 is first closed at instant $t_1$ for a given time interval $t_2$–$t_1$. After this time interval $t_2$–$t_1$ elapses, this switch 74 is opened and simultaneously switch 76 is closed. After an additional given time interval $t_3$-$t_2$, this switch 76 is reopened. Afterwards, both capacitors 70 and 74 are recharged using voltage sources 66 and 68 in order to generate the next pulse u(t), as depicted in FIG. 3 in a diagram shown as a function of time t. When first switch 74 closes at instant $t_1$, actuating device 80 transmits a trigger signal $S_T$ via control line 34 to the control input of receiving unit 30, which is depicted in greater detail in FIG. 4.

The generated pulse u(t) according to FIG. 3 is symmetric with respect to time axis t, i.e., it has no d.c. offset. In addition, this pulse u(t) at its center frequency has a distinctive spectral component. This center frequency depends on whether, for example, data are transmitted on electrode lead 4 or whether electrode lead 4 is laid in the vicinity of power lines that are also used for data transmission. Data transmission of this type generally occurs within a frequency range of, for example, 30 kHz to 500 kHz. If the pulse width of generated pulse u(t) is selected as correspondingly narrow, its center frequency is over 500 kHz. At a pulse width corresponding to the reciprocal of the pulse duration $t_3$–$t_1$ of, for example, 2 µs, the center frequency is 500 kHz. In other words, the pulse width of generated pulse u(t) should be smaller than 2 µs. Since this pulse has only minute spectral components below its center frequency, interference from data transmission equipment is approximately zero. In principle, other pulse shapes may also be used. However, in the selection of other pulse shapes, it should be ensured to the greatest extent possible that there is no d.c. offset present and that a distinct spectral component is present at a center frequency. Under these conditions, pulse u(t) can be generated especially inexpensively and with a high degree of efficiency, as per FIG. 3. The requirement that the pulse should if possible have no d.c. offset stems from the fact that isolation transformer 44 of feed device 26 cannot transmit a d.c. offset within the frequency spectrum of pulse u(t).

Figure 4:
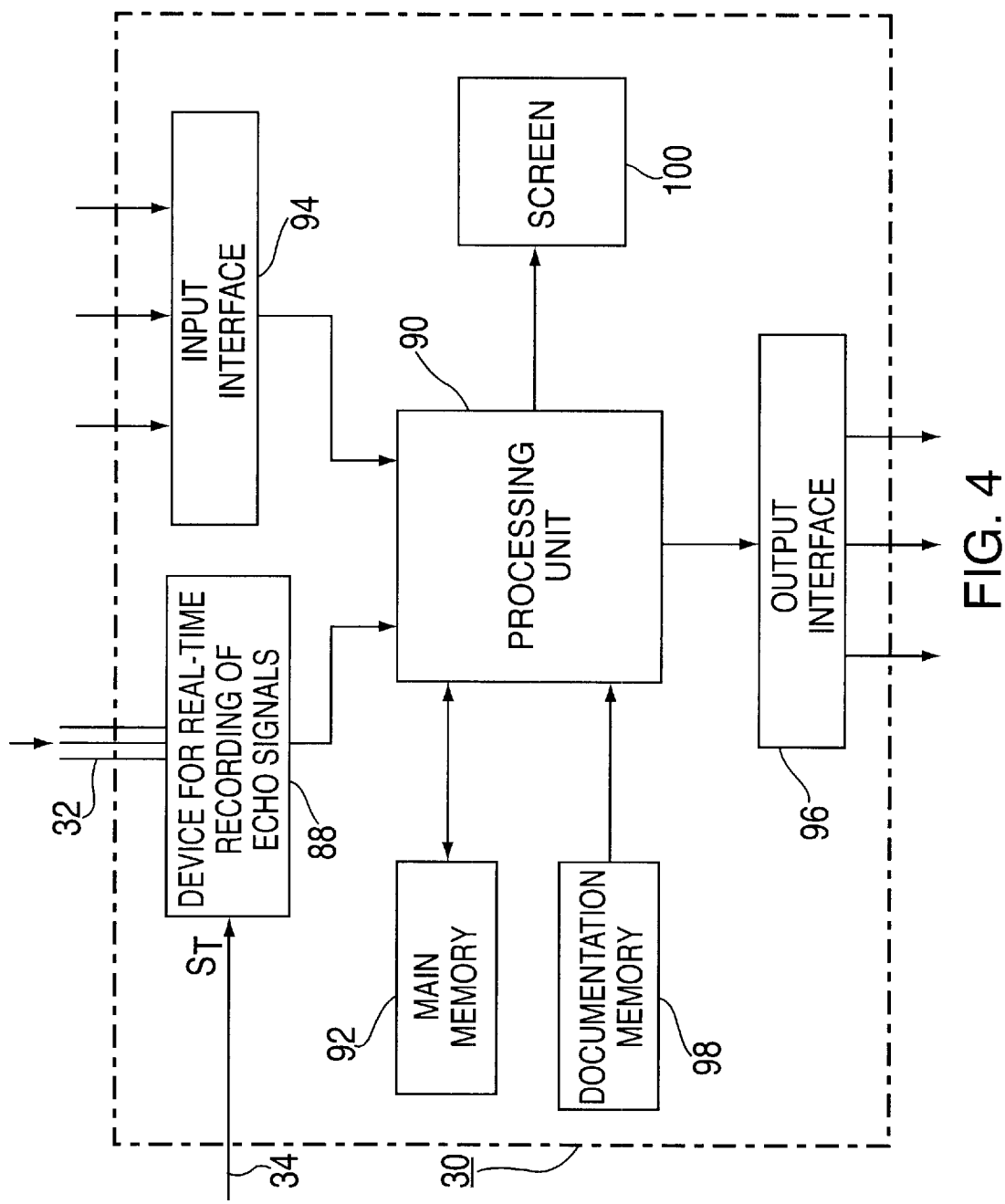
FIG. 4 shows a basic circuit diagram of the receiving unit of the device according to FIG. 1.

FIG. 4 shows a basic circuit diagram of receiving unit 30 according to FIG. 1. This receiving unit 30 has a device 88 for real-time recording of echo signals, a processing unit 90, a main memory 92 and an input and output interface 94 and 96. In addition, this receiving unit 30 also has a documentation memory 98 and a screen 100. The input of device 88 for the real-time recording of echo signals is linked to the input connection of receiving unit 30, to which coaxial cable 32 is connected. Moreover, a control connection of this device 88 is connected to the control input of receiving unit 30, to which control line 34 is connected. On the output side, this device 88 for real-time recording is linked to processing unit 90, which, in turn, is linked to main memory 92 and documentation memory 98 so that data can be exchanged. On the input side, this processing unit 90 is also linked to input interface 94, in particular a binary input interface, and on the output side to screen 100 and output interface 96, in particular a binary output interface. Via these two interfaces 94 and 96, receiving unit 30 is connected to a master system controller (not shown in greater detail). Receiving unit 30 receives operating and setting parameters from this system controller, which is a part of the instrumentation and control equipment of the HVDCT system. A generated indicator signal or status signals arrive at the instrumentation and control equipment via output interface 96.

Device 88 for real-time recording of echo signals composed of an analog/digital converter and a memory, in particular a read/write memory, that is connected in series with the A/D converter. This A/D converter is started via trigger pulse $S_T$ from pulse generator 28, i.e., the A/D converter begins with the digitization of the analog input signals, i.e., the incoming echo signals. These digital sampled values are saved after the digitization. These two components of device 88 work online, i.e., the incoming echo signals are processed in real time. The sampling frequency of the A/D converter and the speed of the storage operation of the digital sampled values depend on the length of electrode lead 4. That means that the echo propagation time is determined by the length of electrode lead 4 and, thus, the time range that is pertinent for an evaluation is established. Furthermore, the sampling frequency also depends on the memory capacity. These stored sampled values form an actual echo curve EK as a function of time as per FIG. 5.

The additional processing of this actual echo curve determined in real-time then occurs offline. For this purpose, these digitized sampled values are copied into main memory 92. In addition, these sampled values can be graphically displayed on screen 100, i.e., the actual echo curve EK depicted in FIG. 5 appears on screen 100. This actual echo curve EK is compared to a dynamic target echo curve stored in main memory 92 using processing unit 90, i.e., an echo difference curve EDK is calculated, as is depicted, for example, in the diagram shown as a function of time t in FIG. 6. This echo difference curve EDK is provided with limit curves GKO and GKU running above and below it. These two limit curves GKO and GKU thus form a tolerance band that is used for pinpointing fault locations.

Figure 5:
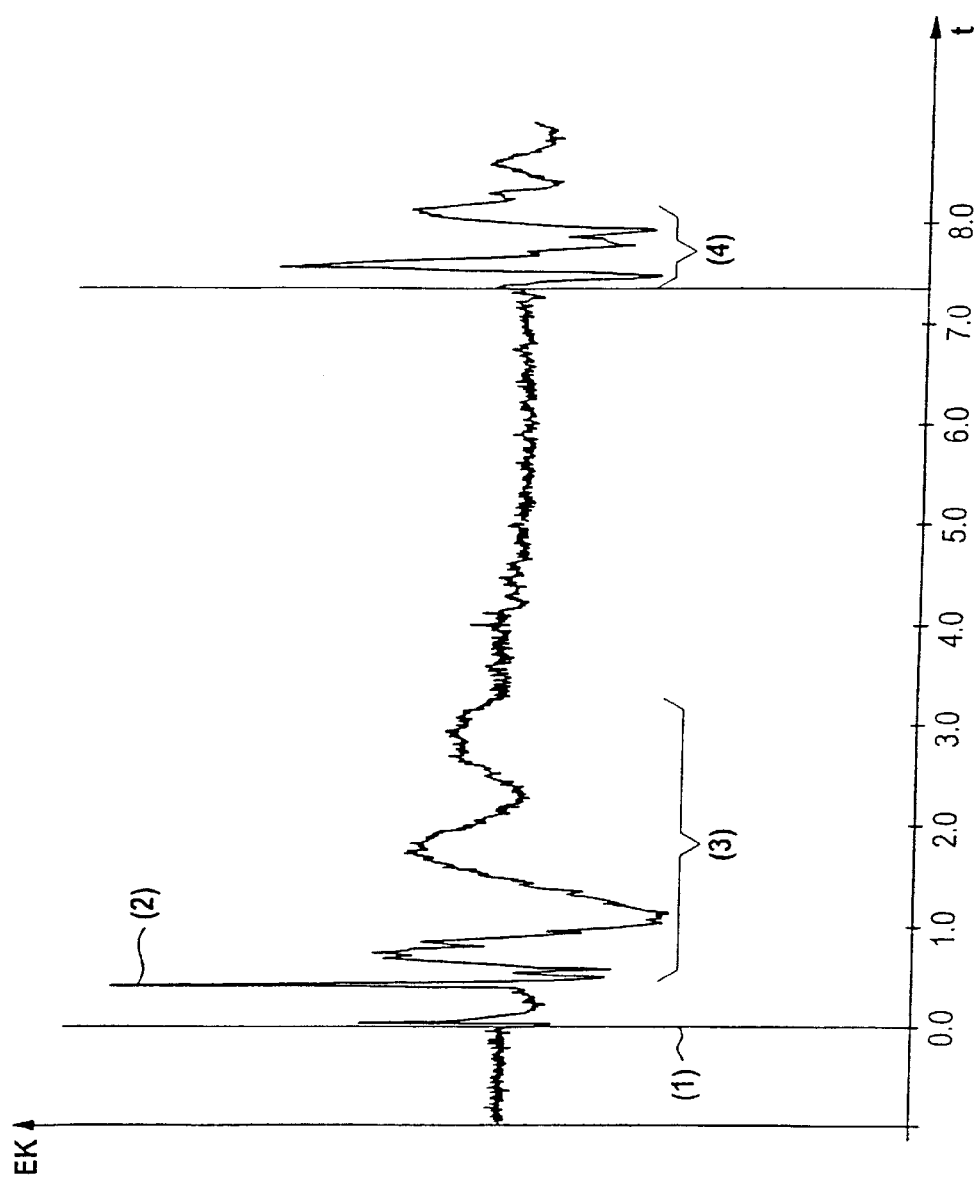
FIG. 5 a recorded actual echo curve of a fault-free electrode lead is depicted in a diagram as a function of time t.
Figure 6:
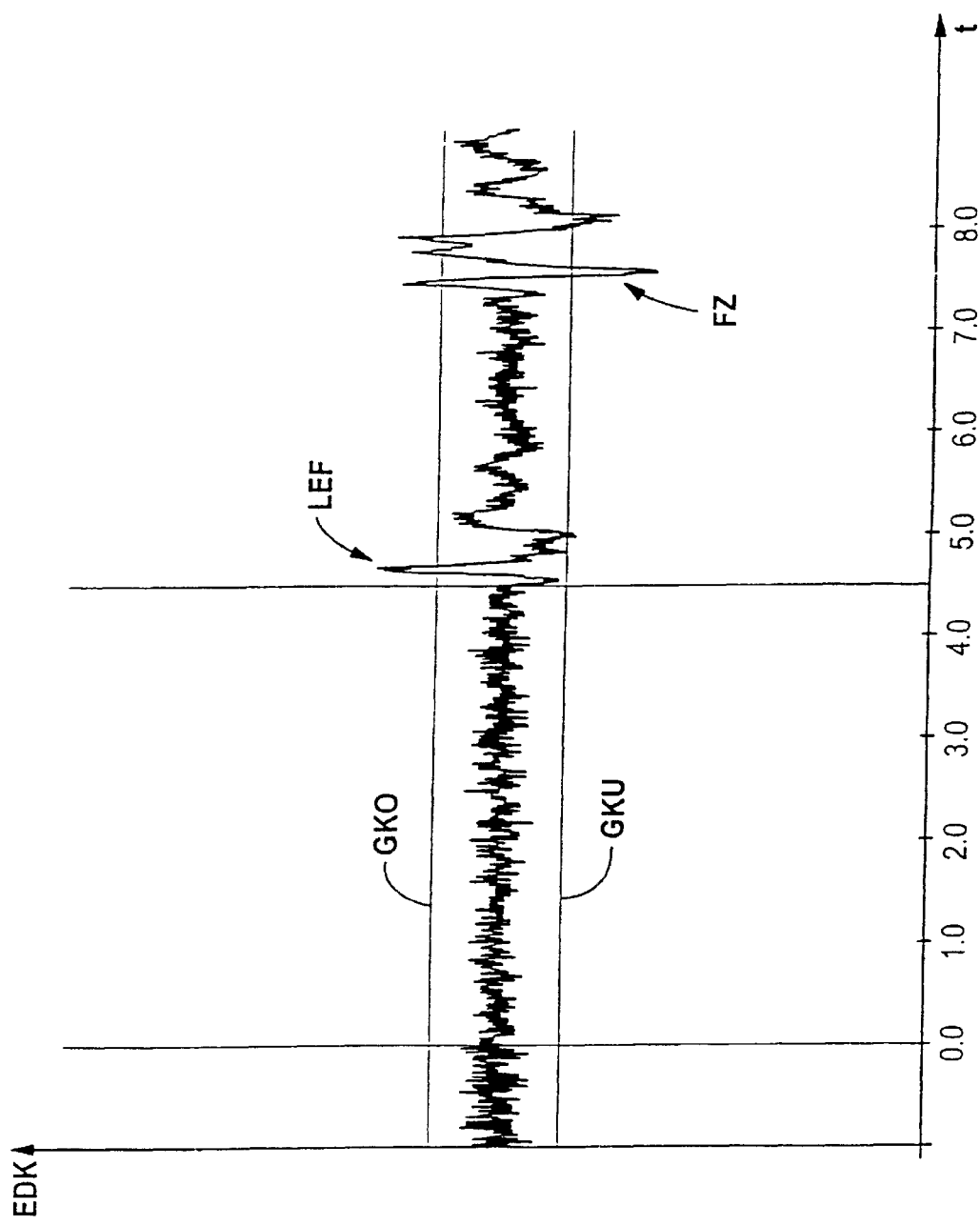
FIG. 6 an echo difference curve for a conductor-ground fault on the electrode lead is depicted in a diagram.

Actual echo curve EK according to FIG. 5 shows that, in the fault-free case, the pulse at the end of electrode lead 4 is reflected in a defined manner. The echo is reflected and is depicted on or evaluated by the receiver within the time range. The result is this depicted actual echo curve EK, which represents the pulse response of the overall system (coaxial cable 32, feed device 26 and fault-free electrode lead 4). This actual echo curve EK represents a fingerprint of the fault-free system. A typical actual echo curve EK of a fault-free electrode lead 4 approximately 7.4 km long is depicted in FIG. 5. The accompanying time axis t of this diagram is parameterized in kilometers of distance. Several ranges can be differentiated in this actual echo curve EK. These ranges are numbered consecutively and are listed below as:

a) Feed pulse (1)
b) Reflection at isolation transformer 44 (2)
c) Building up or decay (transient) process of the feed device (3)
d) Defined reflection from the end of the electrode lead (4)

If a fault occurs on electrode lead 4 (conductor-ground fault or open circuit) then an additional echo results from the fault location. This leads to an alteration of actual echo curve EK. According to the illustration of FIG. 6, a conductor-ground fault is located approximately 4.5 km from feed point 36,38 and produces either a clear echo or a deflection LEF. Simultaneously, defined echo curve EK is also distorted by the end of the electrode lead, which is illustrated in the difference curve as a second deflection FZ. First deflection LEF, which occurs sooner, always stems from the fault location and is to be taken into account for the determination of the fault location if this is desired as an indication. Conclusions about the type of fault (conductor-ground fault or open circuit) can generally also be drawn from the shape or the strength of the echo reflected by the fault location. However, for an ongoing monitoring of electrode lead 4 for faults, it is generally sufficient to monitor echo difference curve EDK for deflections LEF that lie outside the tolerance band.

As already mentioned, a dynamic target echo curve is used to create echo difference curve EDK. This target echo curve is constructed from at least two actual echo curves $EK_1$ and $EK_2$ recorded consecutively, a mean value echo curve that is then saved as the target echo curve being formed from these two curves $EK_1$ and $EK_2$. This calculation is continued dynamically. In other words, a new actual echo curve $EK_3$ is used to calculate a new target echo curve, the first actual echo curve $EK_1$ being no longer used. A calculation of this type can be performed using a shift register, a new curve always being read in and the oldest curve being shifted out. The mean value echo curve is calculated from the curves that are present inside the shift register. Thus, after each trigger pulse $S_T$ a new dynamic target echo curve is calculated. This calculation is begun only after the comparison of a current actual echo curve to a current target echo curve signals a fault-free state. Setting parameters are used to determine how many actual echo curves are to be used to calculate a dynamic target echo curve.

By this use of a dynamic, target echo curve that can vary over time, influences of the seasons on electrode lead 4 are taken into account in the monitoring procedure so that a fault case can be uniquely detected.

Figure 7:
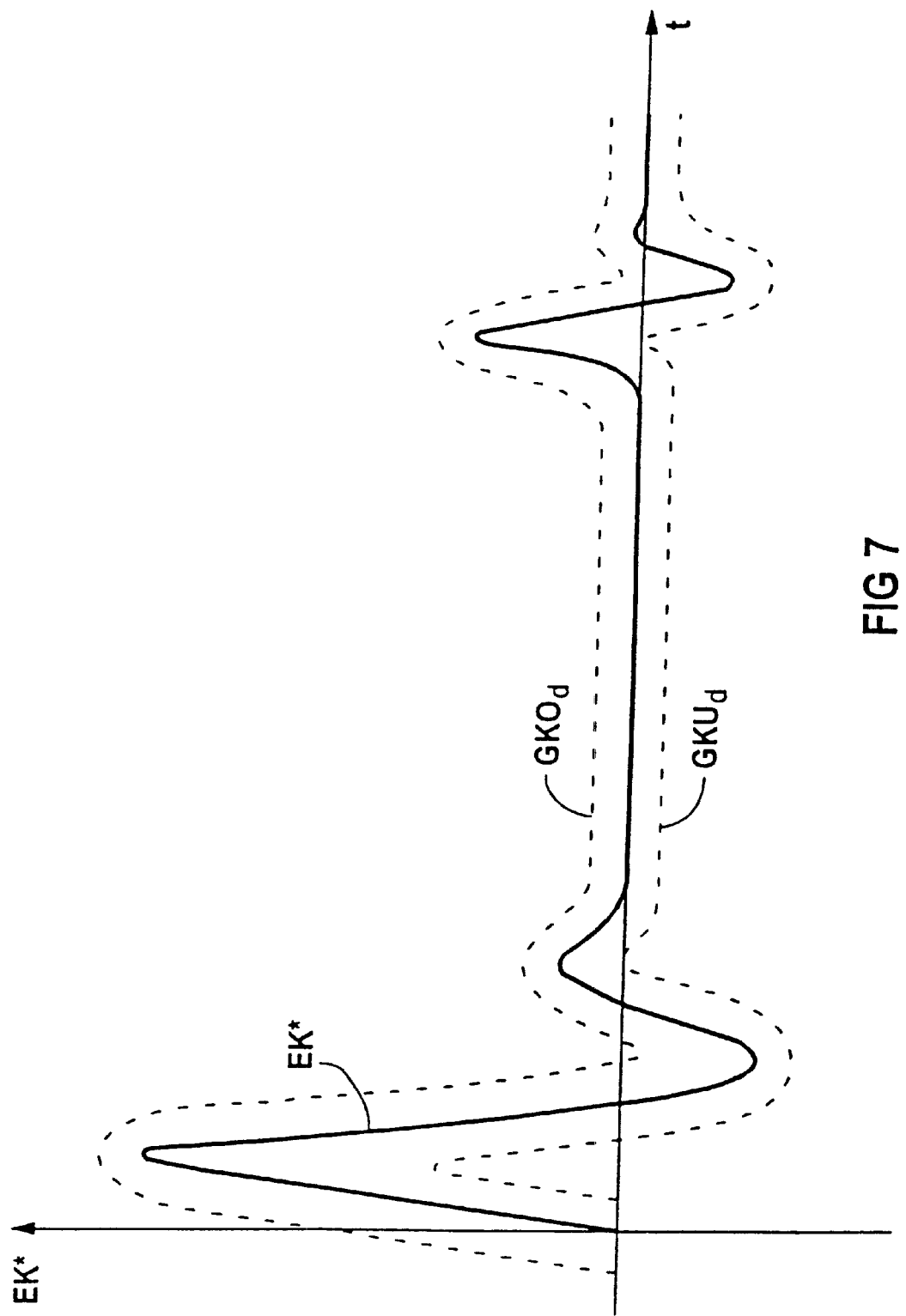
FIG. 7 shows a static target echo curve having an accompanying tolerance band in a diagram versus time t.

In addition to the dynamic evaluation, an additional static evaluation also takes place. In this static evaluation, a fixed target echo curve EK*, which cannot vary over time and which is assigned to a certain operational situation of electrode lead 4, is used. This static target echo curve EK* is flanked by a tolerance band formed by limit curves $GKO_d$ and $GKU_d$ according to the illustration of FIG. 7. In the static evaluation, a constructed dynamic target echo curve is compared to static target echo curve EK* so as to determine whether this dynamic target echo curve still lies within the constructed tolerance band. If this proves not to be the case at least once within a given time interval, a fault signal is generated. As soon as a fault signal is generated, device 2 for monitoring an electrode lead 4 is switched off until it is manually reset. When a fault signal is generated, the instantaneous dynamic target echo curve and a number of previous actual echo curves are temporarily stored in documentation memory 98 for documentation purposes.

The tolerance band of static target echo curve EK* and the tolerance band of the echo difference curve are adjusted using setting parameters. A static target echo curve EK* that belongs to a particular operational situation of electrode lead 4 is retrieved using operating parameters. The presence of a plurality of static target echo curves EK* saved in the main memory is a preconditions for this.

| Reference number list | |
|---|---|
| 2 | Device for monitoring an electrode lead |
| 4 | Electrode lead |
| 6 | Static converter station |
| 8, 10 | d. c. line |
| 12, 14 | Static converter |
| 16 | Connection bus |
| 18 | Branch point |
| 20, 22 | Line |
| 24 | Pulse echo monitoring device |
| 25 | Equipment for pulse conversion |
| 26 | Feed device |
| 28 | Pulse generator |
| 30 | Receiving unit |
| 32 | Coaxial cable |
| 34 | Control line |
| 36, 38 | Feed connection |
| 40, 42, 54, 56 | Diverter |
| 44 | Isolation transformer |
| 46, 48 | Coil |
| 50, 52 | Coupling capacitor |
| 58, 60 | High-voltage winding |
| 62 | Low-voltage winding |
| 64, 84, 86 | Connection point |
| 66, 68 | Voltage source |
| 70, 72 | Capacitor |
| 74, 76 | Switch |
| 78, 80 | Resistor |
| 82 | Actuating device |
| 88 | Device for real-time recording |
| 90 | Processing unit |
| 92 | Main memory |
| 94 | Input interface |
| 96 | Output interface |
| 100 | Screen |
| u(t) | Pulse |
| EK, $EK_1$, $EK_2$, $EK_3$ | Actual echo signal |
| GKO, GKU, $GKO_d$, $GKU_d$ | Limit curve |
| EDK | Echo difference curve |
| EK* | Target echo curve |
| LEF | Deviation at point of fault |
| FZ | Echo distortion deviation |
| $S_T$ | Trigger signal |
| $t_1$, $t_2$, $t_3$ | Points in time |
| $t_2-t_1$, $t_3-t_2$ | Time interval |

What is claimed is:

1. A method for the electrical monitoring of an electrode lead of a bipolar high-voltage d.c. transmission system, the electrode lead being divided at a branch point into two lines, the method comprising:

generating an electrical pulse signal that is asymmetric with respect to ground potential and outputting the generated asymmetric pulse signal and a trigger signal for output of the generated pulse signal;

converting the generated asymmetric pulse signal into a pulse signal that is symmetric with respect to ground potential in push/pull mode;

injecting the push/pull mode pulse signal into the two lines of the electrode lead;

forming a dynamic target echo curve by recording an actual echo curve produced as a function of the injection of the push/pull mode pulse signal;

forming an actual echo curve by real-time recording for a given time of an echo signal produced as a function of the injection of an additional puss/pull mode pulse signal;

forming an echo difference curve by deriving a difference between the recorded actual echo curve and the dynamic target echo curve;

checking the echo difference curve for amplitudes that go outside a first tolerance band constructed from two predetermined constant limit curves arranged symmetrically with respect to a time axis;

generating a fault signal as soon as at least one case of exceeding limits of the first tolerance band is present; and shutting down the pulse generation as soon as one fault signal is present.

2. The method according to claim 1, wherein a mean value echo curve that is stored as a target echo curve is formed for a continuous generation of the dynamic target echo curve from at least two consecutive actual echo curves of a fault-free operation of the electrode lead.

3. The method according to claim 1, further comprising:

forming a predetermined static target echo curve, the static target echo curve being flanked by a second tolerance band formed from limit curves running above and below;

checking against the second tolerance band as to whether a formed dynamic target echo curve still runs within the second tolerance band of the static target echo curve;

generating the fault signal as soon as an amplitude of the dynamic target echo curve to be monitored lies outside the second tolerance band within a given-time interval; and switching the pulse generation off as a function of the fault signal.

4. The method according to claim 3, wherein the second tolerance band of the static target echo curve is generated as a function of predetermined operating parameters of the electrode lead.

5. The method according to claim 3, further comprising:

creating and storing a static target echo curve for each of various operating conditions.

6. The method according to claim 1, wherein the push/pull mode pulse is fed at a distance of approximately ¼ of a free-space wavelength of a center frequency of the generated asymmetric pulse from the branch point of the electrode lead into the two lines.

7. The method according to claim 1, wherein the asymmetric pulse signal is periodically generated.

8. The method according to claim 1, wherein a pulse signal with no d.c. offset is generated an as the asymmetric pulse signal.

9. The method according to claim 1, further comprising:

when the fault signal is generated, saving the instantaneous dynamic target echo curve and the instantaneous recorded actual echo curve for documentation purposes.

10. The method according to claim 1, further comprising:

continually storing a predetermined number of recorded actual curves for documentation purposes.

11. A device for the electrical monitoring of an electrode lead divided at a branch point into two lines in a bipolar high-voltage d.c. transmission system, comprising:

a feed device coupled on an output side to each feed connection of the two lines of the electrode lead, the feed device including a device for pulse conversion and two coupling capacitors, the two coupling capacitors connecting outputs of the device for pulse conversion to outputs of the feed device; and a pulse echo monitoring device including a pulse generator and a receiving unit, the pulse echo monitoring device coupled on an output side to input connections of the feed device.

12. The device according to claim 11, wherein an isolation transformer having a low-voltage winding and two high-voltage windings is provided as the device for pulse conversion, a connection point of the isolation transformer connected to ground potential.

13. The device according to claim 12, wherein an isolation transformer, two coils and two diverters are provided as the device for pulse conversion, one of the coils and one of the diverters being coupled in parallel with each of the high-voltage windings.

14. The device according to claim 11, wherein the pulse generator has two voltage sources, two capacitors, two switches, two resistors and one actuating device for the switches, each of the capacitors is electrically connected to one of the voltage sources so as to conduct, one connection point of the two capacitors and one connection point of the two voltage sources are each connected to ground potential, each of the capacitors being connected via the switch to an output of the pulse generator, and wherein the actuating device is connected to a control input of the pulse generator.

15. The device according to claim 11, wherein the receiving unit includes a device for real-time recording of echo-signals, a processing unit, a main memory and an input and output interface, a control input of the receiving unit is connected to a control input of the device for the real-time recording of echo signals, wherein the processing unit is coupled to the main memory, the device for real-time recording and to the input and output interfaces, wherein a signal input of the device for real-time recording is connected to an input of the receiving unit, and wherein a master system controller is coupled an input and an output side to the output and input interfaces.

16. The device according to claim 15, wherein the device for real-time recording has an analog/digital converter with a memory connected in series.

17. The device according to claim 15, wherein the receiving unit has a documentation memory that is connected to the processing unit.

18. The device according to claim 15, wherein the receiving unit has a screen connected on an input side of the processing unit.

19. The device according to claim 11, wherein the feed connections of the lines of the electrode lead are each located at a distance from the branch point of the electrode lead.

20. The device according to claim 19, wherein the distance is one quarter of a free-space wavelength of a center frequency of an asymmetric pulse generated by the pulse generator.

21. The device according to claim 11, wherein the feed connections are each connected to ground potential via a diverter.

22. The device according to claim 11, wherein the pulse generator and the receiving unit form the pulse echo monitoring device.

23. The device according to claim 11, wherein a coaxial cable is provided as a connection line between the pulse generator and the feed device, and between the feed device and the receiving unit.

24. The device according to claim 23, wherein the coaxial cable is double-shielded.

* * * * *